(12) United States Patent
Seki et al.

(10) Patent No.: US 8,304,872 B2
(45) Date of Patent: Nov. 6, 2012

(54) LEAD FRAME, METHOD FOR MANUFACTURING THE SAME AND SEMICONDUCTOR DEVICE

(75) Inventors: Kazumitsu Seki, Nagano (JP); Muneaki Kure, Nagano (JP); Akemi Nozaki, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 363 days.

(21) Appl. No.: 12/626,030

(22) Filed: Nov. 25, 2009

(65) Prior Publication Data
US 2010/0127369 A1 May 27, 2010

(30) Foreign Application Priority Data
Nov. 27, 2008 (JP) ................. 2008-301976

(51) Int. Cl.
*H01L 23/495* (2006.01)
(52) U.S. Cl. ........................ 257/677; 257/666
(58) Field of Classification Search .................. 257/666, 257/677
See application file for complete search history.

(56) References Cited

U.S. PATENT DOCUMENTS

| | | | | |
|---|---|---|---|---|
| 6,593,643 | B1 * | 7/2003 | Seki et al. ............... | 257/677 |
| 7,816,780 | B2 * | 10/2010 | Kajiwara et al. ........... | 257/692 |
| 7,977,775 | B2 * | 7/2011 | Yato et al. ............... | 257/666 |
| 2008/0145607 | A1 * | 6/2008 | Kajiwara et al. ........... | 428/137 |
| 2008/0173097 | A1 * | 7/2008 | Bauer et al. ............... | 73/756 |
| 2010/0207263 | A1 * | 8/2010 | Nikitin et al. ............ | 257/690 |
| 2010/0210071 | A1 * | 8/2010 | Mahler et al. ............ | 438/107 |
| 2011/0237031 | A1 * | 9/2011 | Yato et al. ............... | 438/119 |

FOREIGN PATENT DOCUMENTS

WO    00/62341    10/2000

* cited by examiner

*Primary Examiner* — Telly Green
(74) *Attorney, Agent, or Firm* — Rankin, Hill & Clark LLP

(57) ABSTRACT

A lead frame includes a lead frame body 21 having a die pad 24 to which a semiconductor chip 12 is bonded and a plurality of leads 25 arranged around the die pad 24 and made of Cu or an alloy containing Cu, and a metallic film formed on the lead frame body 21 and to connected to a metallic wire 15 connected to the electrode pad 36 of the semiconductor chip 12. The metallic film is an Ag-plated film 22 with nanoparticles 34 arranged in gaps 33 among Ag crystal grains 31.

14 Claims, 9 Drawing Sheets

| | DETECTED QUANTITY OF Cu (atom %) |
|---|---|
| SAMPLE 1 | THAN DETECTION LIMIT OR LOWER |
| SAMPLE 2 | 13.5 |
| SAMPLE 3 | 1.3 |
| SAMPLE 4 | 1.8 |

LEAD FRAME, METHOD FOR MANUFACTURING THE SAME AND SEMICONDUCTOR DEVICE

CROSS-REFERENCE TO RELATED APPLICATION

This application is based on and claims priority under U.S.C. §119 from Japanese Patent Application No. 2008-301976 filed on Nov. 27, 2008.

BACKGROUND OF THE INVENTION

1. Technical Field

This invention relates to a lead frame, a method for manufacturing the same and a semiconductor device, and more particularly to a lead frame having an Ag film (including an Ag-plated film) formed on a lead frame body and to be connected to a metallic wire connected to an electrode pad of a semiconductor chip, a method for manufacturing the same and a semiconductor device having the same.

2. Related Art

There are some conventional semiconductor devices including a semiconductor chip, a lead frame electrically connected to the semiconductor chip through a metallic wire and a mold resin sealing the semiconductor chip (see FIG. 1).

FIG. 1 is a sectional view of a conventional semiconductor device.

Referring to FIG. 1, a conventional semiconductor device 200 includes a lead frame 201, a semiconductor chip 203 and a mold resin 206.

The lead frame 201 includes a lead frame body 211 and an Ag film 212. The lead frame body 211 has a die pad 214 and a plurality of leads 215 arranged around the die pad 214. The lead frame body 211 may be made of Cu, an alloy containing Cu or an 42 alloy. Where the lead frame body 211 is made of the 42 alloy, a Cu film (not shown) serving as a contact layer is formed between the Ag film 212 and the lead frame body 211. The Cu film serves to improve the contact between the Ag film 212 and the lead frame body 211.

The Ag film 212 is formed on an upper surface 217A of an inner lead segment 217 of each the leads 215. The upper surface 212A of the Ag film 212 is connected to a metallic wire 204 (e.g. an Au wire) connected to the electrode pad 221 of the semiconductor chip 203. Thus, the Ag film 212 is electrically connected to the semiconductor chip 203. The Ag film 212 has high purity of Ag (99.9%). The Ag film 212 serves to prevent Cu contained in the lead frame body 211 (where the 42 alloy is used, Cu contained in the Cu film formed between the Ag film 212 and the lead frame body 211) from being deposited onto the upper surface 212A of the Ag film 212. To this end, the Ag film 212 must be so thick that Cu is not deposited onto the upper surface 212A of the Ag film 212. Concretely, the thickness of the Ag film 212 may be e.g. 4 μm to 5 μm.

The semiconductor chip 203 is bonded to the upper surface 214A of a die pad 214 using an adhesive 205 (e.g. Ag paste). In bonding the semiconductor chip 203 to the upper surface 214A of the die pad 214, the lead frame body 211 is heated (e.g. at the temperature of 175° C. to 200° C. for one hour so that the adhesive 205 is hardened). The semiconductor chip 203 has a plurality of electrode pads 221. The electrode pads 221 each is connected to the metallic wire 204. The metallic wire 204 is formed with the lead frame body 211 being heated (e.g. for 1 to 5 minutes at the temperature of 200° C. to 250° C.).

The mold resin 206 seals the semiconductor chip 203, the metallic wire 204, the die pad 214, a portion of the lead 215 and the Ag film 212. The mold resin 206 is hardened by heating (for 1 to 2 minutes at the temperature of 175° C. to 200° C.) (see, e.g. Patent Reference 1).
[Patent Reference 1] WO00/62341

FIG. 2 is a view for explaining the problem involved with the semiconductor device. Arrows in FIG. 2 indicate a moving path of Cu contained in the lead 215.

However, where the thickness of the Ag film 212 using expensive Ag is decreased (4 μm or less) in order to reduce the cost of the lead frame 201, owing to the heating while the semiconductor device 200 is manufactured (e.g. heating in hardening the adhesive 205, heating in forming the metallic wire 204, and heating in hardening the mold resin 206), as shown in FIG. 2, Cu contained in the lead 215 moves through the gaps 226 among Ag crystal grains 225 (in other words, Cu is diffused into the gap 226 among the Ag crystal grains 225) so that it will be deposited onto the upper surface 212A of the Ag film 212; thus, copper oxide 227 will be formed on the supper surface 212A of the Ag film 212 to deteriorate the contact with the metallic wire 204. This gives rise to a problem that the metallic wire 204 cannot be connected to the upper surface 212A of the Ag film 212.

SUMMARY OF THE INVENTION

This invention has been accomplished in order to solve the problem described above. An object of this invention is to provide a lead frame capable of decreasing the thickness of an Ag film, thereby reducing the cost and surely connecting a metallic wire to the upper surface of the Ag film, a method for manufacturing the same and a semiconductor device having the same.

According to a first aspect of this invention, there is provided a lead frame including:

a lead frame body having a die pad to which a semiconductor chip is bonded and a plurality of leads arranged around the die pad and made of Cu or an alloy containing Cu, and a metallic film formed on the lead frame body and to be connected to a metallic wire connected to the electrode pad of the semiconductor chip, wherein the metallic film is an Ag-plated film with nanoparticles arranged in gaps among Ag crystal grains.

Besides, nanoparticles mean grains having diameter of less or equal to 5 μm.

In accordance with this invention, by employing the Ag-plated film with the carbon grains arranged in the gaps among the Ag crystal grains as the metallic film to be connected to the metallic wire connected to the electrode pad of the semiconductor chip, the carbon grains block the diffusion paths (gaps among the Ag crystal grains) of Cu. Thus, it is possible to prevent Cu contained in the lead frame body from being deposited onto the upper surface of the Ag-plated film. Accordingly, the thickness of the Ag-plated film can be decreased (e.g. 0.3 μm to 3 μm) so that the lead frame can be reduced in cost and the metallic wire can be surely connected to the upper surface of the Ag-plated film. Further, by decreasing the thickness the Ag-plated film, the Ag-plated film can be formed in a short time so that productivity of the lead frame can be improved.

According to a second aspect of this invention, there is provided a lead frame including:

a lead frame body having a die pad to which a semiconductor chip is bonded and a plurality of leads arranged around the die pad, a Cu film formed on the lead frame body, and a metallic film formed on the Cu film and to be connected to a metallic wire connected to the electrode pad of the semiconductor chip, wherein the metallic film is an Ag-plated film with nanoparticles arranged in gaps among Ag crystal grains.

In accordance with this invention, by employing the Ag-plated film with the carbon grains arranged in the gaps among the Ag crystal grains as the metallic film to be connected to the metallic wire connected to the electrode pad of the semiconductor chip, the carbon grains block the diffusion paths (gaps among the Ag crystal grains) of Cu. Thus, it is possible to prevent Cu contained in the Cu film from being deposited onto the upper surface of the Ag-plated film. Accordingly, the thickness of the Ag-plated film can be decreased (e.g. 0.3 μm to 3 μm) so that the lead frame can be reduced in cost and the metallic wire can be surely connected to the upper surface of the Ag-plated film. Further, by decreasing the thickness the Ag-plated film, the Ag-plated film can be formed in a short time so that productivity of the lead frame can be improved.

According to a third aspect of this invention, there is provided the lead frame according to the first or second aspect, wherein the diameter of each the nanoparticles is within a range from 0.01 μm to 0.5 μm.

According to a fourth aspect of this invention, there is provided a semiconductor device including:

a lead frame according to any one of the first to third aspects, the semiconductor chip bonded to the die pad, the metallic wire of electrically connecting the metallic film and the electrode pad, and a mold resin of sealing a part of the leads, the semiconductor chip, the metallic wire and the Ag-plated film.

In accordance with such a configuration, the semiconductor device can be reduced in cost and improved in productivity.

According to a fifth aspect of this invention, there is provided a method for manufacturing a lead frame including: a lead frame body having a die pad to which a semiconductor chip is bonded and a plurality of leads arranged around the die pad and made of Cu or an alloy containing Cu, and a metallic film formed on the lead frame body and to be connected to a metallic wire connected to the electrode pad of the semiconductor chip, the method including a step of:

preparing an Ag plating solution dispersed with nanoparticles each having a grain diameter of 0.01 μm to 0.5 μm by electrolytic plating using the Ag plating solution, forming an Ag-plated film containing the carbon grains, as the metallic film, on the lead frame body of the portion corresponding to the region of forming the metallic film.

In accordance with this invention, by electrolytic plating using an Ag plating solution dispersed with carbon grains each having a grain diameter of 0.01 μm to 0.5 μm, an Ag-plated film containing the carbon grains is formed, as the metallic film, on the lead frame body of the portion corresponding to the region of forming the metallic film. Thus, the carbon grains contained in the Ag-plated film block the gaps among the Ag crystal grains which are the diffusion paths of Cu (Cu contained in the lead frame body) so that the thickness of the Ag-plated film can be decreased (e.g. 0.3 μm to 3 μm). For this reason, the lead frame can be reduced in cost and the metallic wire can be surely connected to the upper surface of the Ag-plated film. Further, by decreasing the thickness the Ag-plated film, the Ag-plated film can be formed in a short time so that productivity of the lead frame can be improved.

According to a sixth aspect of this invention, there is provided a method for manufacturing a lead frame including: a lead frame body having a die pad to which a semiconductor chip is bonded and a plurality of leads arranged around the die pad, a Cu film formed on the lead frame body, and a metallic film formed on the Cu film and to be connected to a metallic wire connected to the electrode pad of the semiconductor chip, the method including the steps of:

by plating, forming the Cu film on the lead frame body of the portion corresponding to the region of forming the metallic film, and by electrolytic plating using an Ag plating solution dispersed with nanoparticles each having a diameter of 0.01 μm to 0.5 μm, forming an Ag-plated film containing the nanoparticles, as the metallic film, on the Cu film.

According to a seventh aspect of this invention, there is provided the method for manufacturing a lead frame according to the fifth aspect, wherein the Ag plating solution contains the nanoparticles by 0.1 wt % to 20 wt %.

In accordance with this invention, by electrolytic plating using an Ag plating solution dispersed with carbon grains each having a grain diameter of 0.01 μm to 0.5 μm, an Ag-plated film containing the carbon grains is formed, as the metallic film, on the Cu film. Thus, the carbon grains contained in the Ag-plated film block the gaps among the Ag crystal grains which are the diffusion paths of Cu (Cu contained in the Cu film) so that the thickness of the Ag-plated film can be decreased (e.g. 0.3 μm to 3 μm). For this reason, the lead frame can be reduced in cost and the metallic wire can be surely connected to the upper surface of the Ag-plated film. Further, by decreasing the thickness the Ag-plated film, the Ag-plated film can be formed in a short time so that productivity of the lead frame can be improved.

In accordance with this invention, by providing an Ag-plated film containing carbon grains blocking the gaps among Ag crystal grains and also decreasing the thickness of the Ag-plated film, the lead frame and semiconductor device can be reduced in cost and a metallic wire can be surely connected the upper surface of the Ag-plated film.

DETAILED DESCRIPTION OF THE PREFERRED EMBODIMENTS

Figure 1:
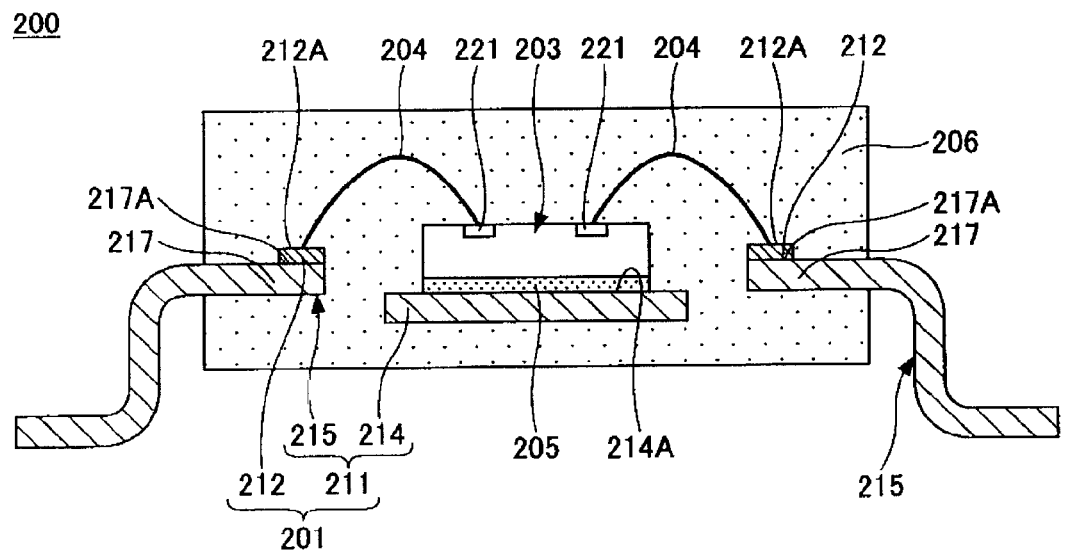
FIG. 1 is a sectional view of a conventional semiconductor device.
Figure 2:
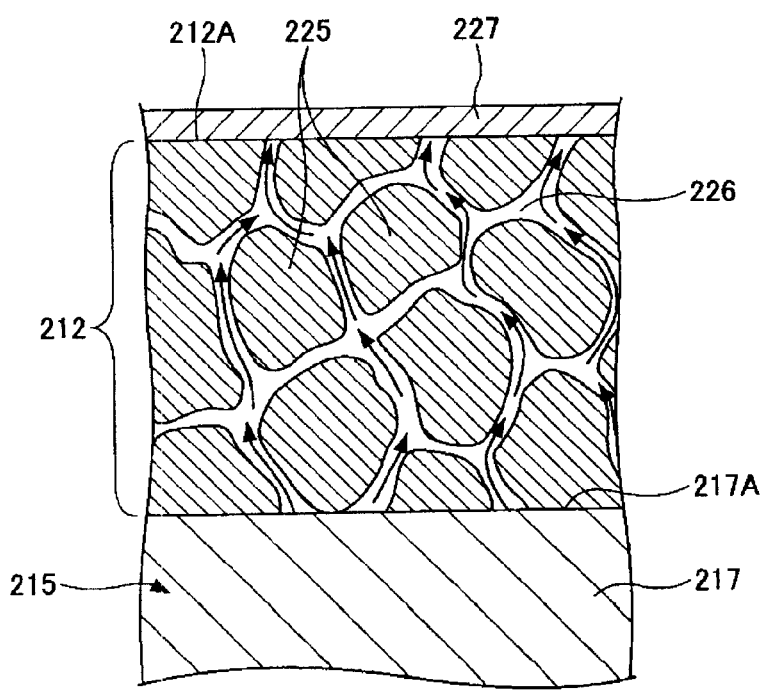
FIG. 2 is a view for explaining the problem involved with the semiconductor device.

Next, referring to the drawings, an explanation will be given of an embodiment of this invention.

Embodiment 1

Figure 3:
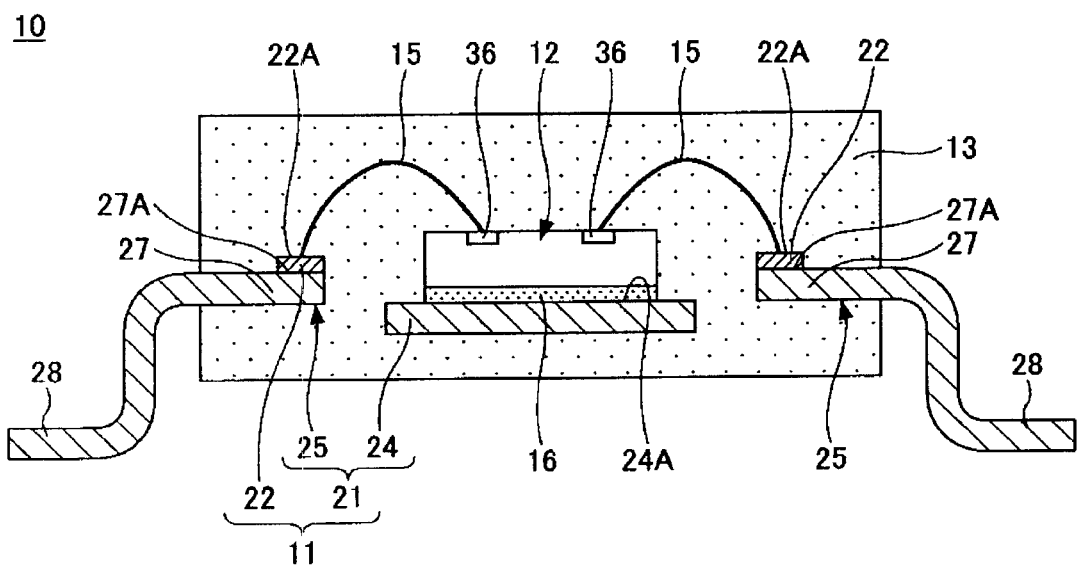
FIG. 3 is a sectional view of a semiconductor device according to the first embodiment of this invention.

FIG. 3 is a sectional view of a semiconductor device according to the first embodiment of this invention.

Referring to FIG. 3, a semiconductor device 10 according to the first embodiment includes a lead frame 11, a semiconductor chip 12 and a mold resin 13.

The lead frame 11 includes a lead frame body 21, an Ag-plated film 22 containing carbon grains (hereinafter referred to as an Ag-plated film 22). The lead frame body 21 includes a die pad 24 and a plurality of leads 25 arranged around the die pad 24.

The die pad 24 serves to bond the semiconductor chip 12 and has a chip bonding surface 24A to which the semiconductor chip 12 is bonded. The die pad 24 is separated from the plurality of leads 25. The die pad 24 is square when viewed from above. The die pad 24 is arranged at a position lower than an inner lead segment 27 on the die pad 24 side.

The leads 25 each has the inner lead segment 27 sealed by the mold resin 13 and an outer lead segment 28 exposed from the mold resin 13 and formed integrally to the inner lead segment 27 and bended.

The lead frame 21 having the above configuration may be made of Cu or an alloy containing Cu.

Figure 4:
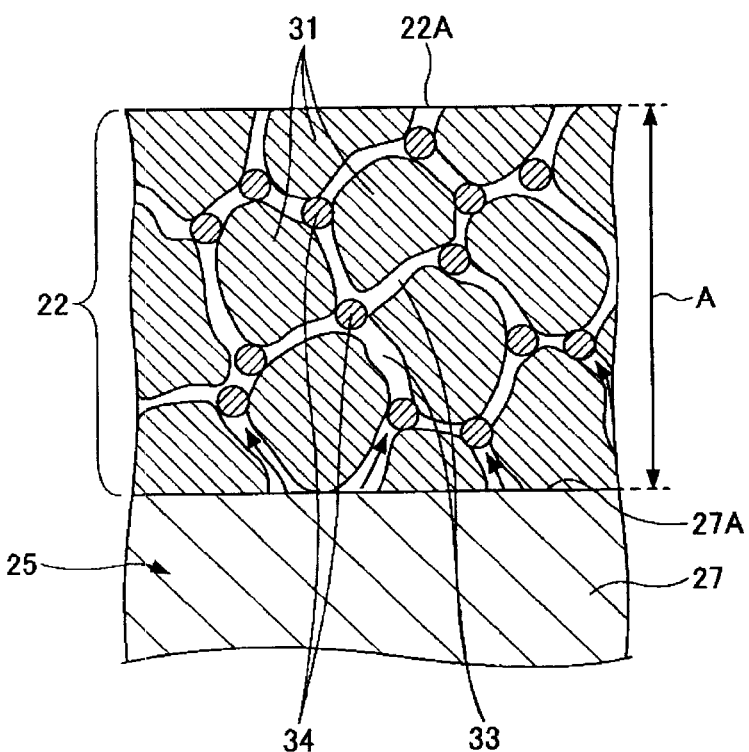
FIG. 4 is a schematic view of the Ag-plated film containing carbon grains formed on a lead frame body.

FIG. 4 is a schematic view of the Ag-plated film containing carbon grains formed on the lead frame body. In FIG. 4, like reference numerals refer to like portions in the semiconductor device 10 according to the first embodiment shown in FIG. 3. FIG. 4 is a view schematically illustrating the observation result of the Ag-plated film 22 by a scanning electron microscope.

Referring to FIGS. 3 and 4, the Ag-plated film 22 is formed on the upper surface 27A of the inner lead segment 27 of the portion corresponding to the region to which a metallic wire 15 (e.g. Au wire) is connected. The metallic wire 15 electrically connected to an electrode pad 36 of the semiconductor chip 12 is connected onto the upper surface 22A of the Ag-plated film 22. The Ag-plated film 22 contains carbon grains 34 arranged so as to the gaps 33 among the Ag crystal grains 31 (paths of diffusing Cu contained in the lead frame body 21. The carbon grains 34 each has a diameter enough to be arranged among the crystal grains 33. Concretely, the gain diameter of each the carbon grains 34 may be 0.01 μm to 5 μm, preferably 0.01 μm to 0.5 μm. The content of the carbon grains 34 contained in the Ag-plated film 22 can be appropriately selected within the range of 0.1 wt % to 10 wt %, preferably 1 wt % to 3 wt %. The carbon grain 34 may be e.g. carbon black. The thickness A of the Ag-plated film 22 may be e.g. 0.3 μm to 3 μm.

In this way, by employing the Ag-plated film 22 with the carbon grains 34 arranged in the gaps 33 among the Ag crystal grains 31 as the metallic film to be connected to the metallic wire 15 (e.g. Au wire) connected to the electrode pad 36 of the semiconductor chip 12, the carbon grains 34 block the diffusion paths (gaps 33 among the Ag crystal grains 31) of Cu (Cu contained in the lead frame body 21). Thus, in heating the lead frame body 21 while the semiconductor device 10 is manufactured, it is possible to prevent Cu contained in the lead frame body 21 from being deposited onto the upper surface 22A of the Ag-plated film 22. Accordingly, the thickness A of the Ag-plated film 22 can be decreased (e.g. 0.3 μm to 3 μm) so that the lead frame 11 can be reduced in cost and the metallic wire 15 can be surely connected to the upper surface 22A of the Ag-plated film 22.

Further, by decreasing the thickness the Ag-plated film 22, this Ag-plated film 22 can be formed in a short time so that productivity of the lead frame 11 can be improved.

The semiconductor chip 12 is bonded to the chip bonding surface 24A of the die pad 24 by an adhesive 16 (e.g. Ag paste). The semiconductor chip 12 has a plurality of electrode pads 36. The electrode pads 36 each is connected to the one end of the metallic wire 15. The electrode pad 36 is electrically connected to the lead 25 through the metallic wire 15 and Ag-plated film 22.

The mold resin 13 seals the semiconductor chip 12, metallic wire 15, Ag-plated film 22 and inner lead segment 27. The material of the mold resin 13 may be e.g. thermosetting epoxy resin.

In accordance with the lead frame according to this embodiment, by employing the Ag-plated film 22 with the carbon grains 34 arranged in the gaps 33 among the Ag crystal grains 31 as the metallic film to be connected to the metallic wire 15 (e.g. Au wire) connected to the electrode pad 36 of the semiconductor chip 12, the carbon grains 34 block the diffusion paths (gaps 33 among the Ag crystal grains 31) of Cu (Cu contained in the lead frame body 21). Thus, in heating the lead frame body 21 while the semiconductor device 10 is manufactured, it is possible to prevent Cu contained in the lead frame body 21 from being deposited onto the upper surface 22A of the Ag-plated film 22. Accordingly, the thickness A of the Ag-plated film 22 can be decreased (e.g. 0.3 μm to 3 μm) so that the lead frame 11 can be reduced in cost and the metallic wire 15 can be surely connected to the upper surface 22A of the Ag-plated film 22.

Further, in accordance with the semiconductor device according to this embodiment, by providing the lead frame 11 with reduced cost and improved in productivity, the semiconductor device 10 can be reduced in cost and improved in productivity.

FIGS. 5 to 15 are views showing the manufacturing process of the semiconductor device according to the first embodiment. In FIGS. 5 to 15, like reference symbols refer to like elements in the semiconductor device 10 according to the first embodiment.

Reference to FIGS. 5 to 15 while explaining the method for manufacturing the semiconductor device 10 according to the first embodiment, the method for manufacturing the lead frame 11 according to this embodiment will be explained.

Figure 5:
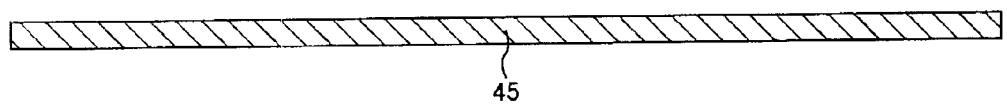
FIG. 5 is a view showing the step of manufacturing the semiconductor device according to the first embodiment of this invention (first).

First, in the step shown in FIG. 5, a plate 45 constituting a motherboard of the lead frame body 21 is prepared. The material of the plate 45 may be e.g. Cu or an alloy containing Cu. The thickness of the plate 45 may be e.g. 125 μm to 150 μm.

Figure 6:
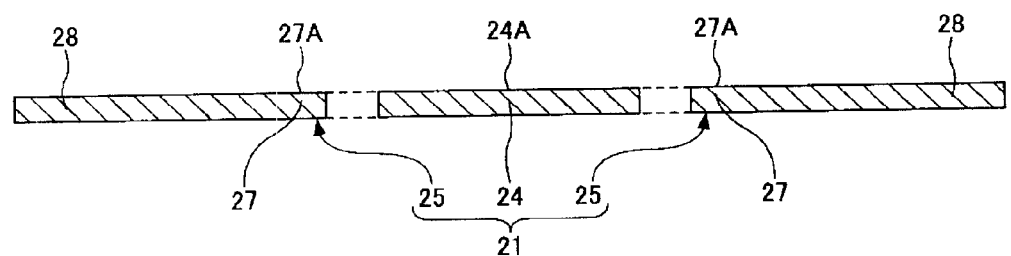
FIG. 6 is a view showing the step of manufacturing the semiconductor device according to the first embodiment of this invention (second).

Next, in the step shown in FIG. 6, the plate 45 shown in FIG. 5 is stamped to form the lead frame body 21 having a die pad 24 and a plurality of leads 25. In this stage, the outer lead segment 28 of the lead frame body 21 is not still bended. Further, at this stage, the die pad 24 is not still depressed more downward than the plurality of leads 25.

Figure 7:
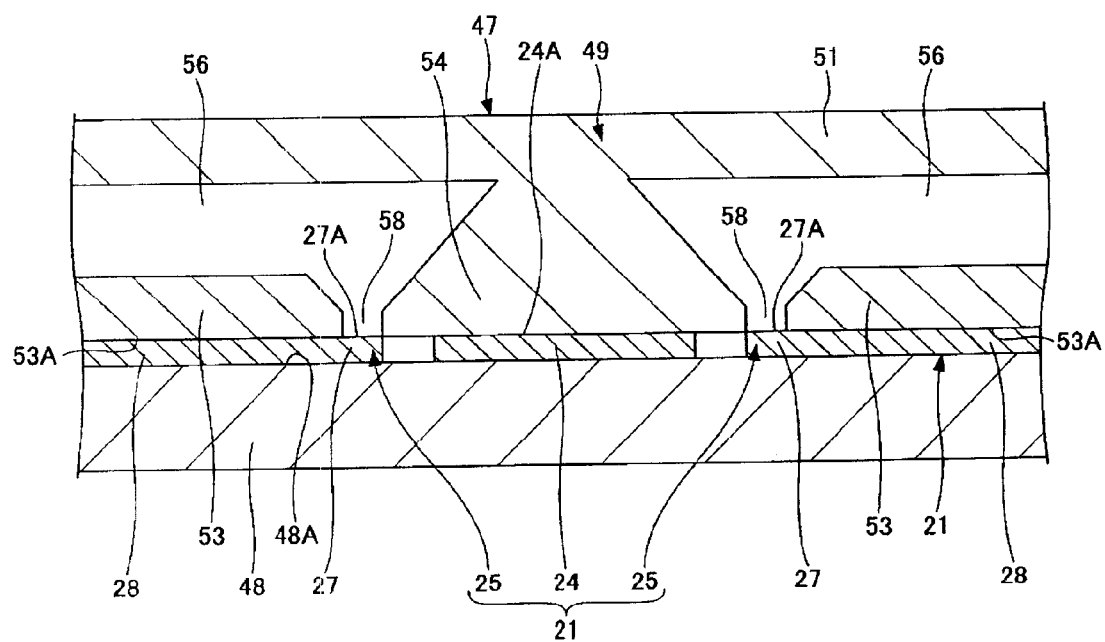
FIG. 7 is a view showing the step of manufacturing the semiconductor device according to the first embodiment of this invention (third).

Next, in the step shown in FIG. 7, the lead frame body 21 shown in FIG. 6 is arranged within a plating device 47. More specifically, with the upper surface 27A of the inner lead segment 27 of the portion corresponding to the region of forming the Ag-plated film 22 being exposed, the lead frame body 21 as shown in FIG. 6 is arranged between a plating solution supplying case 51 and a stage section 48 described later.

Now, the structure of the plating device 47 will be explained. The plating device 47 includes the stage section 48 and a plating solution supplying section 49. The surface 48A of the stage section 48 is a portion in contact with the lower surface of the lead frame body 21 shown in FIG. 6. The plating solution supplying section 49 includes the plating solution supplying case 51, a first plating mask 53, a second plating mask 54 and a plating solution accommodating section 56.

The plating solution supplying case 51 has a supplying mouth (not shown) for supplying a plating solution to the plating solution accommodating section 56. The first plating mask 53 is formed integrally to the plating solution supplying case 51. The first plating mask 53 serves to prevent the Ag-plated film 22 from being formed on the plurality of leads 25 of the portion corresponding to the region other than the region of forming the Ag-plated film 22. The lower surface 53A of the first plating mask 53 is in contact with the upper surface of each the plurality of leads 25 of the portion corresponding to the region other than the region of forming the Ag-plated film 22.

The second plating mask 54 is formed integrally to the plating solution supplying case 51. The second plating mask 54 serves to prevent the Ag-plated film 22 from being formed on the chip bonding surface 24A. The second plating mask 54 is in contact with the entire chip bonding surface 24A.

Between the first plating mask 53 and the second plating mask 54, an opening 58 is made to expose the upper surface 27A of each the plurality of inner lead segments 27 of the portion corresponding to the region of forming the Ag-plated film 22.

The plating solution section 56 serves as a space for accommodating a plating solution for forming an Ag-plated film plating solution 62 described later) which is supplied to the upper surface 27A of each the plurality of inner lead segments 27 of the portion corresponding to the region of forming the Ag-plated film 22 via the opening 58.

Figure 8:
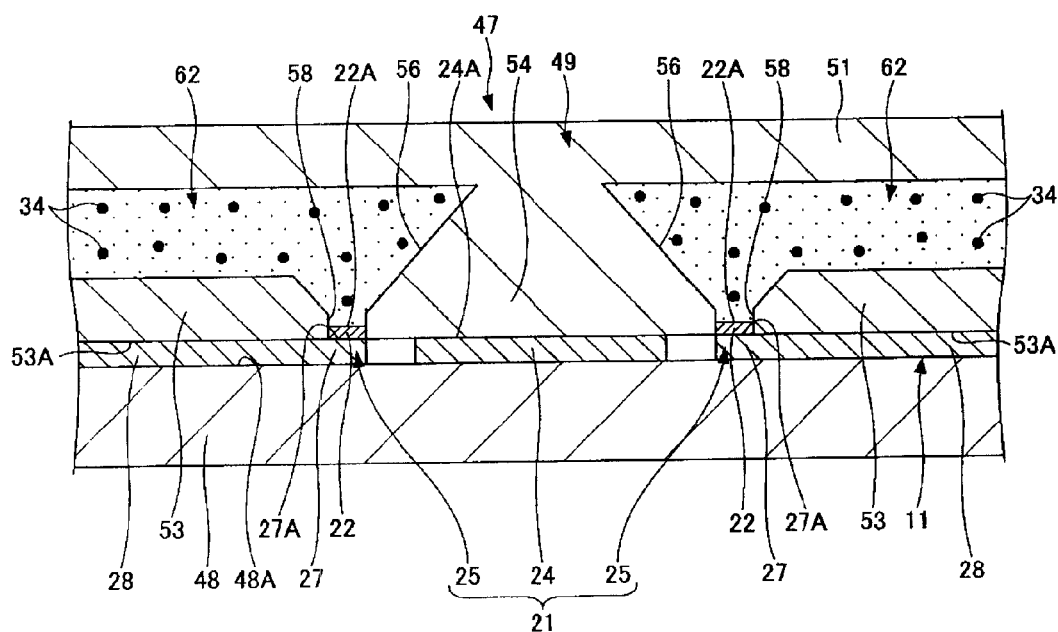
FIG. 8 is a view showing the step of manufacturing the semiconductor device according to the first embodiment of this invention (fourth).

Next, in the step shown in FIG. 8, by electrolytic plating using the Ag plating solution 62 dispersed with carbon grains 34 each having a grain diameter of 0.01 μm to 0.5 μm in the plating solution accommodating section 56, the Ag-plated film 22 containing the carbon grains 34 is formed on the upper surface 27A of each the plurality of inner lead segments 27 of the portion corresponding to the region of forming the Ag-plated film 22 (In this case, minus electricity is applied to the lead frame body 21).

In this way, the configuration shown in FIG. 4 as described above, more specifically the Ag-plated film 22 with the carbon grains 34 arranged in the gaps 33 among the Ag crystal grains 31 is formed. Further, by executing the step shown in FIG. 8, the lead frame 11 with the outer lead segment 28 still not being bended is formed. The thickness A of the Ag-plated film 22 may be e.g. 0.3 μm to 3 μm.

Thus, by electrolytic plating using the Ag plating solution 62 dispersed with carbon grains 34 each having a grain diameter of 0.01 μm to 0.5 μm, the Ag-plated film 22 containing the carbon grains 34 is formed on the upper surface 27A of each the plurality of inner lead segments 27 of the portion corresponding to the region of forming the Ag-plated film 22. Thus, the carbon grains 34 of preventing Cu from being diffused are arranged so as to block the gaps 33 among the Ag crystal grains 31 so that the thickness of the Ag-plated film 22 can be decreased (e.g. 0.3 μm to 3 μm). Accordingly, the lead frame 11 can be reduced in cost and the metallic wire 15 (e.g. Au wire) can be surely connected to the upper surface 22A of the Ag-plated film 22. Further, by decreasing the thickness of the Ag-plated film 22, this Ag-plated film 22 can be formed in a short time so that productivity of the lead frame 11 can be improved.

The Ag plating solution 62 is preferably an Ag plating solution dispersed with carbon black of the carbon grains 34 by 0.1 wt % to 20 wt % (plating solution containing silver potassium cyanide, conductive salt, silver cyanide solution). If the carbon grains 34 are dispersed in the Ag plating solution 62 by 0.1 wt % or less, the number of the carbon grains 34 existing in the gaps 33 among the Ag grains 31 is not enough so that Cu contained in the lead frame body 21 will be diffused into the gaps 33 among the Ag crystal grains 31 thereby to form copper oxide on the upper surface 22A of the Ag-plated film 22. On the other hand, if the carbon grains 34 are dispersed in the Ag plating solution 62 by 20 wt % or more, carbon (carbon grains 34) will be deposited onto the upper surface 22A of the Ag-plated film 22 so that its connection with the metallic wire (e.g. Au wire) 15 will be deteriorated.

Further, where carbon black is dispersed in the Ag plating solution 62 as the carbon grains 34, the carbon black with high hydration not requiring a dispersing agent is preferably employed.

Additionally, in the step shown in FIG. 8, in order that the carbon grains 34 contained in the Ag plating solution 62 are distributed at a greater rate on the side of the lead frame body 21, after the Ag plating solution 62 is prepared, the Ag-plated film 22 containing the carbon grains 34 may be formed on the upper surface 27A of each the plurality of inner lead segments 27 of the portion corresponding to the region of forming the Ag-plated film 22. More specifically, for example, in the early stage of electrolysis, with the current density being low (e.g. 10 A/dm$^2$) the Ag-plated film containing a large amount of the carbon particles 34 is formed, and thereafter with the current density being high (e.g. 40 A/dm$^2$), on the Ag-plated film containing a large amount of the carbon grains 34, the Ag-plated film containing a very small amount of the carbon grains 34 as formed, thereby forming the Ag-plated film 22 including the two Ag-plated films having different contents (densities) of the carbon grains 34.

Figure 9:
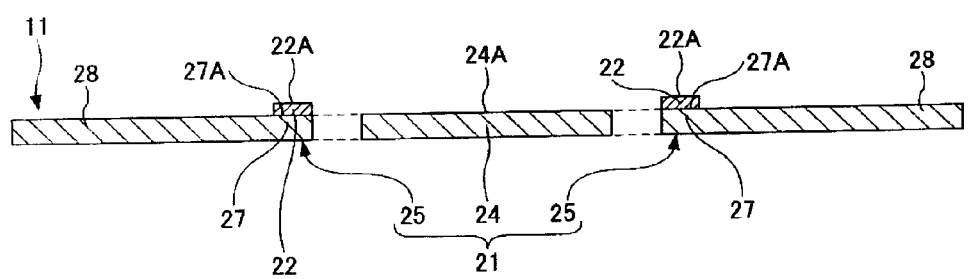
FIG. 9 is a view showing the step of manufacturing the semiconductor device according to the first embodiment of this invention (fifth).
Figure 10:
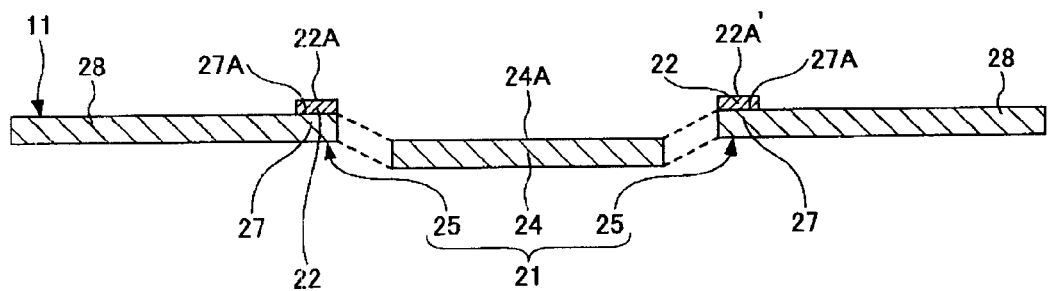
FIG. 10 is a view showing the step of manufacturing the semiconductor device according to the first embodiment of this invention (sixth).

Next, in the step shown in FIG. 9, the lead frame 11 shown in FIG. 8 is taken out from the plating device 47. In the step shown in FIG. 10, by stamping, the die pad 24 is depressed so that the die pad 24 is located at a lower position than the plurality of leads 25.

In this way, the die pad 24 is located at a lower position than the plurality of leads 25 so that the size of the semiconductor device 10 can be reduced in its thickness direction.

Figure 11:
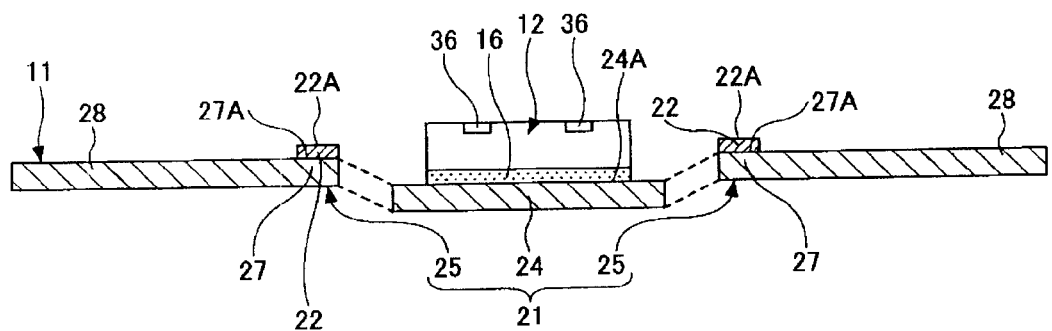
FIG. 11 is a view showing the step of manufacturing the semiconductor device according to the first embodiment of this invention (seventh).

Next, in the step shown in FIG. 11, using the adhesive 16 (e.g. Ag paste), the semiconductor chip 12 having the plurality of electrode pads 36 is bonded to the chip bonding surface 24A of the die pad 24. Where the Ag paste is employed as the adhesive 16, in order to harden the resin (e.g. epoxy resin) contained in the Ag paste, the lead frame body 21 is heated (under the heating condition of e.g. the heating temperature of 175° C. to 200° C. and the heating time of one hour). As described above, the Ag-plated film 22 has a configuration in which the carbon grains 34 preventing Cu from being diffused are arranged in the gaps 33 among the Ag crystal grains 31 so that Cu contained in the lead frame body 21 will not be deposited onto the upper surface 22A of the Ag-plated film 22 by the heating processing in the step shown in FIG. 11.

Figure 12:
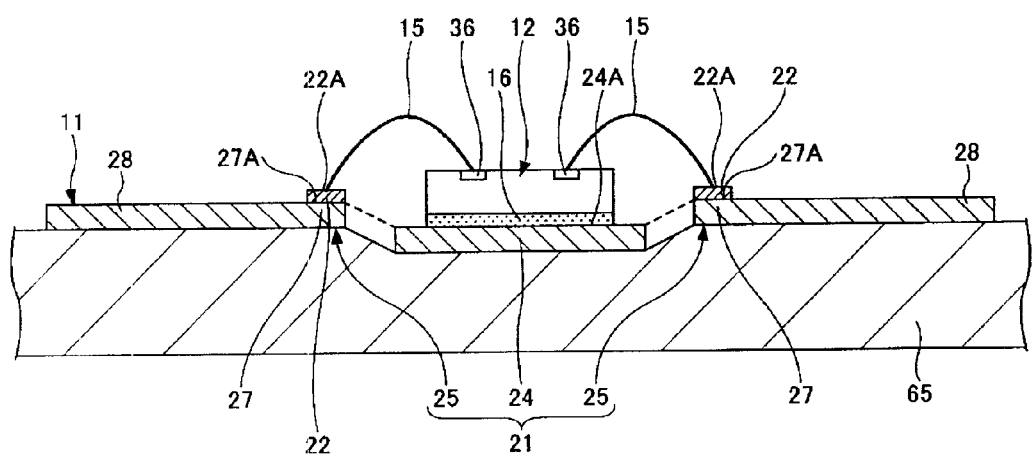
FIG. 12 is a view showing the step of manufacturing the semiconductor device according to the first embodiment of this invention (eighth).

Next, in the step shown in FIG. 12, the structure shown in FIG. 11 (specifically, the lead frame 11 with the semiconductor chip 12 bonded) is arranged on a heater block 65. In this state, the lead frame 11 is heated by the heater block 65 (under the heating condition of e.g. the heating temperature of 200° C. to 300° C. and the heating time of 30 sec to 60 sec).

Further, by wire bonding, the metallic wire 15 (e.g. Au wire) to be connected to the upper surface 22A of the Ag-plated film 22 and the electrode pad 36 is made. As described above, the Ag-plated film 22 has a configuration in which the carbon grains 34 preventing Cu from being diffused are arranged in the gaps 33 among the Ag crystal grains 31 so that Cu contained in the lead frame body 21 will not be deposited onto the upper surface 22A of the Ag-plated film 22 by the heating processing in the step shown in FIG. 12.

Figure 13:
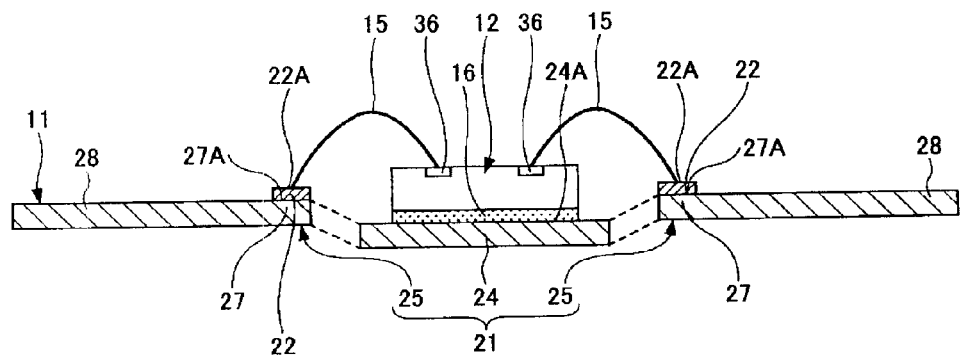
FIG. 13 is a view showing the step of manufacturing the semiconductor device according to the first embodiment of this invention (ninth).

Next, in the step shown in FIG. 13, after the metallic wire 15 is formed, the lead frame 11 wire-bonding connected to the semiconductor chip 12 is dismantled from the heater block 65 shown in FIG. 12.

Figure 14:
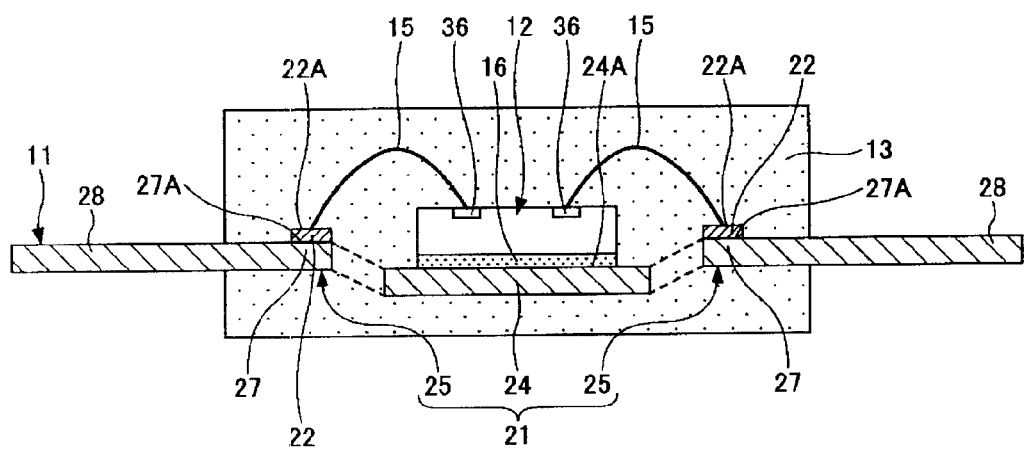
FIG. 14 is a view showing the step of manufacturing the semiconductor device according to the first embodiment of this invention (tenth).

Next, in the step shown in FIG. 14, the mold resin 13 is formed to seal the semiconductor chip 12, metallic wire 15, Ag-plated film 22 and inner lead segment 27 provided in the structure shown in FIG. 13 (specifically, the lead frame 11 wire-bonding connected to the semiconductor chip 12). The mold resin 13 can be formed using e.g. transfer molding. The material of the mold resin 13 may be e.g. thermosetting epoxy resin.

Where the material of the mold resin 13 is the thermosetting epoxy resin, by heating the structure shown in FIG. 14 (under the heating condition of e.g. the heating temperature of 175° C. to 200° C. and the heating time of 1 to 2 minutes), the mold resin 13 is hardened. As described above, the Ag-plated film 22 has a configuration in which the carbon grains 34 preventing Cu from being diffused are arranged in the gaps 33 among the Ag crystal grains 31 so that Cu contained in the lead frame body 21 will not be deposited onto the upper surface 22A of the Ag-plated film 22 by the heating processing in the step shown in FIG. 14.

Figure 15:
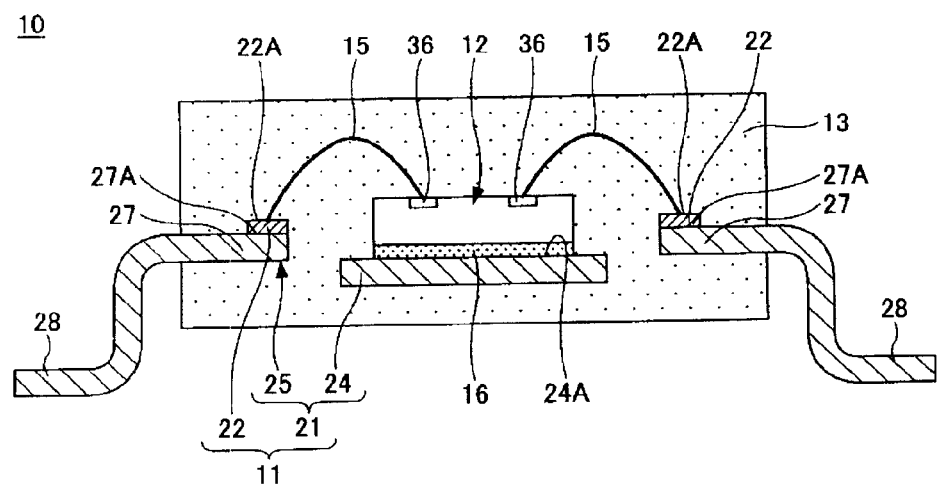
FIG. 15 is a view showing the step of manufacturing the semiconductor device according to the first embodiment of this invention (eleventh).

Next, in the step shown in FIG. 15, by bending the outer lead segment 28 of the structure shown in FIG. 14, the semiconductor device 10 according to the first embodiment is manufactured.

In accordance with the method for manufacturing the lead frame according to this embodiment, by electrolytic plating using the Ag plating solution 62 dispersed with carbon grains 34 each having a grain diameter of 0.01 μm to 0.5 μm, the Ag-plated film 22 containing the carbon grains 34 is formed on the upper surface 27A of each the plurality of inner lead segments 27 of the portion corresponding to the region of forming the Ag-plated film 22. Thus, the carbon grains 34 of preventing Cu from being diffused are arranged to block the gaps 33 among the Ag crystal grains 31 so that the thickness A of the Ag-plated film 22 can be decreased (e.g. 0.3 μm to 3 μm). Accordingly, the lead frame 11 can be reduced in cost and the metallic wire 15 (e.g. Au wire) can be surely connected to the upper surface 22A of the Ag-plated film 22. Further, by decreasing the thickness A of the Ag-plated film 22, this Ag-plated film 22 can be formed in a short time so that productivity of the lead frame 11 can be improved.

In this embodiment, the die pad 24 is located at a lower position than the plurality of leads 25. However, also in the lead frame having the configuration in which the die pad 24 and plurality of leads 25 (plurality of leads 25 before bended) are flush with each other, the same advantage as in this embodiment can be obtained.

Figures 16, 17:
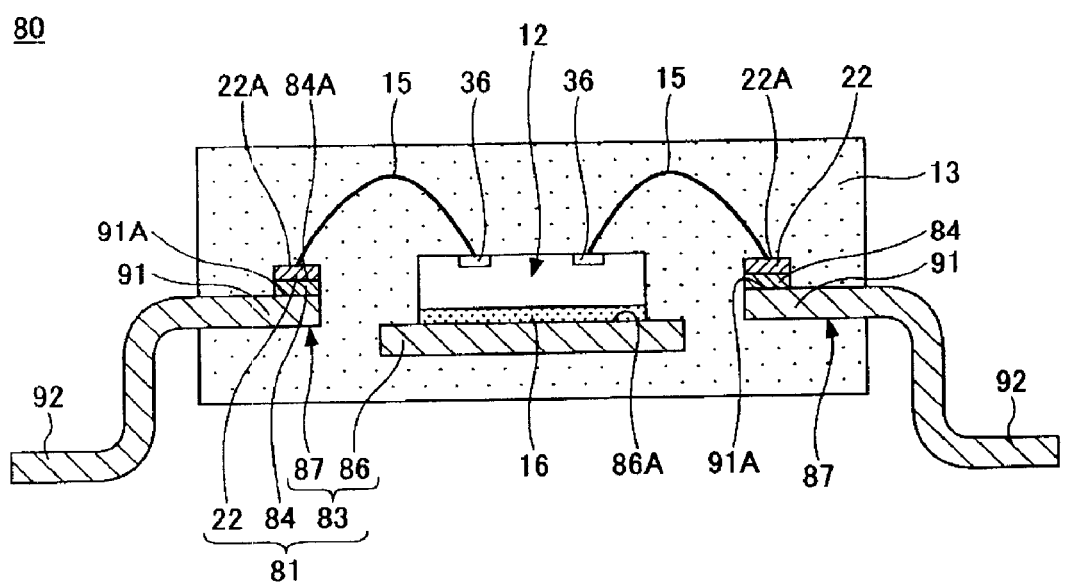
FIG. 16 is a graph showing the experimental result of verifying the advantage of this invention.
FIG. 17 is a sectional view of a semiconductor device according to the second embodiment of this invention.

Now, an explanation will be given of an experimental result of verifying the advantage of this invention. In this experiment, the following samples 1 to 4 (samples 1 and 2 are conventional products (comparative examples) and samples 3 and 4 are samples manufactured by the manufacturing method according to this invention) are prepared. Thereafter, the detected amount of Cu in the upper surface of the Ag-plated film formed in each of these samples is evaluated by the AES (Auger Electron Spectroscopy) qualitative/quantitative analysis (under the analysis condition of the probe diameter of ϕ50 μm, accelerating voltage of 10 KeV and probe current of $1 \times 10^{-8}$ A) (The experimental result is shown in FIG. 16).

As the sample 1, using the Ag plating solution not containing the carbon grains 34, the Ag-plated film not containing the carbon grains 34 and having a thickness of 1 μm is formed on the lead frame body 21.

In the sample 2, using the Ag plating solution not containing the carbon grains 34, the Ag-plated film not containing the carbon grains 34 and having a thickness of 1 μm is formed on the lead frame body 21, and thereafter heated under the condition of the heating temperature of 400° C. and the heating time of one minute.

In the sample 3, using the Ag plating solution dispersed with the carbon grains 34 in the Ag plating solution by 1 wt %, the Ag-plated film with the carbon grains 34 (Ag-plated film 22 with the carbon grains 34 of preventing Cu from being diffused, arranged in the gaps 33 among the Ag crystal grains 31) and having a thickness of 1 μm is formed on the lead frame body 21 is formed and thereafter heated under the condition of the heating temperature of 400° C. and the heating time of one minute.

In the sample 4, using the Ag plating solution dispersed with the carbon grains 34 in the Ag plating solution by 5 wt %, the Ag-plated film containing the carbon grains 34 (Ag-plated film 22 with the carbon grains 34 of preventing Cu from being diffused, arranged in the gaps 33 among the Ag crystal grains 31) and having a thickness of 1 μm is formed on the lead frame body 21 and thereafter heated under the condition of the heating temperature of 400° C. and the heating time of one minute.

FIG. 16 is a graph showing the experimental result of verifying the advantage of this invention.

From the detected amount of Cu in the samples 1 and 2 shown in FIG. 16, it can be seen that Cu is deposited onto the upper surface of the Ag-plated film not containing the carbon grains 34 by executing the heating processing (in this case, at 400° C. and for one minute).

From the detected amount of Cu in the samples 2 to 4 shown in FIG. 16, it can be seen that Cu is not almost deposited onto the upper surface of the Ag-plated film containing the carbon grains 34 (Ag-plated film 22 with the carbon grains 34 of preventing Cu from being diffused, arranged in the gaps 33 among the Ag crystal grains 31) after the heating processing (in this case, at 400° C. and for one minute). Further, from the detected amount of Cu in the sample 3 and 4 shown in FIG. 16, it can be seen that there is no difference in the effect of preventing Cu from being diffused between the Ag-plated film formed using the Ag plating solution dispersed with the carbon grains 34 in the Ag plating solution by 1 wt % and the Ag-plated film formed using the Ag plating solution dispersed with the carbon grains 34 in the Ag plating solution by 5 wt %.

From the above experimental result, it could be confirmed that it is possible to prevent Cu contained in the lead frame body 21 from being deposited onto the upper surface 22A of the Ag-plated film 22 by forming the Ag-plated film 22 with the carton grains 34 (Ag-plated film with the carbon grains 34 of presenting Cu from being diffused, arranged in the gaps 33 among the Ag crystal grains 31) on the lead frame body 21, using the Ag plating solution 62 dispersed with the carbon grains 34 in the Ag plating solution.

Embodiment 2

FIG. 17 is a sectional view of a semiconductor device according to the second embodiment of this invention. In FIG. 17, like reference symbols refer to like parts in the semiconductor device 10 according to the first embodiment.

Referring to FIG. 17, a semiconductor device 80 according to the second embodiment is structured in the same fashion as the semiconductor 10 except that a lead frame 81 is provided in place of the lead frame 11 provided in the semiconductor device 10 according to the first embodiment.

The lead frame 81 is structured in the same fashion as the lead frame 11 except that a lead frame body 83 is provided in place of the lead frame body 21 provided in the lead frame 11 explained in this first embodiment and a further a Cu film 84 is formed.

The lead frame body 83 includes a die pad 86 having a chip bonding surface 86A and a plurality of leads 87 arranged to surround the die pad 86 and each having an inner lead segment 91 and an outer lead segment 92 formed integrally thereto. The die pad 86 is formed in the same shape as the die pad 24 explained in the first embodiment. Using the adhesive 16, the semiconductor chip 12 is bonded onto the chip bonding surface 86A. The lead 87 is formed in the same shape as the lead 25 explained in the first embodiment.

The lead frame body 83 is made of a material different from that of the lead frame body 21 (specifically, Cu or Cu alloy). The material of the lead frame 83 may be e.g. an alloy containing very little Cu (e.g. 42 alloy).

The Cu film 84 is formed on the upper surface 91A of the inner lead segment 91 at the portion corresponding to the region of forming the Ag-plated film 22 with the carbon grains 34 arranged in the gaps 33 among the Ag crystal grains 31. On the upper surface 84A of the Cu film 84, the Ag-plated film 22 is formed. The Cu film 84 serves to improve the contact between the Ag-plated film 22 and inner lead segment 91. The Cu film 84 may be e.g. a Cu-plated film. The Cu film 84 can be formed by e.g. electrolytic plating. The thickness of the Cu film 84 may be 0.1 µm to 0.3 µm.

In accordance with the lead frame according to this embodiment, by employing the Ag-plated film 22 with the carbon grains 34 arranged in the gaps 33 among the Ag crystal grains 31 as the metallic film to be connected to the metallic wire 15 connected to the electrode pad 36 of the semiconductor chip 12, the carbon grains 34 block the diffusion paths (gaps 33 among the Ag crystal grains 31) of Cu. Thus, in heating the lead frame body 83 while the semiconductor device 80 is manufactured, it is possible to prevent Cu contained in the Cu film 84 from being deposited onto the upper surface 22A of the Ag-plated film 22. Accordingly, the thickness A of the Ag-plated film 22 can be decreased (e.g. 0.3 µm to 3 µm) so that the lead frame 81 can be reduced in cost and the metallic wire 15 can be surely connected to the upper surface 22A of the Ag-plated film 22.

Further, in accordance with the semiconductor device according to this embodiment, by providing the lead frame 81 reduced in cost and improved in productivity, the semiconductor device 80 can be reduced in cost and improved in productivity.

The semiconductor device 80 according to this embodiment can be manufactured in the same process as in the semiconductor device 10 according to the first embodiment except that the step of forming the Cu film 84 (step of forming the Cu film 84 by e.g. electrolytic plating) is added between the step shown in FIG. 6 and the steps of forming the Ag-plated film 22, explained in the first embodiment. The Cu film 84 can be formed by the same technique as the steps of forming the Ag-plated film 22 (steps shown in FIGS. 7 to 9) explained in the first embodiment.

Embodiment 3

Figure 18:
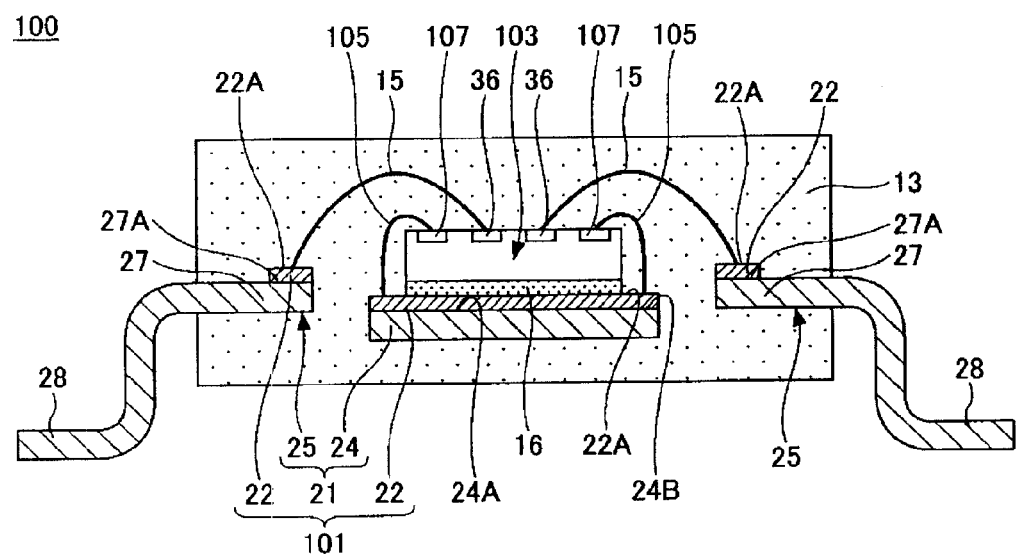
FIG. 18 is a sectional view of a semiconductor device according to the third embodiment of this invention.

FIG. 18 is a sectional view of a semiconductor device according to the third embodiment of this invention. In FIG. 18, like reference symbols refer to like parts in the semiconductor device 10 according to the first embodiment.

Referring to FIG. 18, a semiconductor device 100 according to the third embodiment is structured in the same fashion as the semiconductor device 10 according to the first embodiment except that a lead frame 101 and a semiconductor chip 103 are provided in place of the lead frame 11 and semiconductor chip 12 provided in the semiconductor device 10 according to the first embodiment.

The lead frame 101 is structured in the same fashion as the lead frame 11 except that in the structure of the lead frame 11, the Ag-plated film 22 (Ag-plated film with the carbon grains 34 arranged in the gaps 33 among the Ag crystal grains 31) is formed to cover the upper surface of the die pad 24 (specifically, the chip bonding surface 24A and the surface 24B of the die pad 24 corresponding to a wire connecting region provided around the chip bonding surface 24A). The upper surface 22A of the Ag-plated film 22 at the portion provided on the surface 24B of the die pad 24 is connected to a metallic wire 105 (e.g. Au wire) connected to each of electrode pads 107 of the semiconductor chip 103.

The semiconductor chip 103 is structured in the same fashion as the semiconductor chip 12 except that the plurality of electrode pads 107 are further provided in the structure of the semiconductor chip 12 explained in the first embodiment. The electrode pads 107 each is connected to the metallic wire 105. The electrode pads 107 each is electrically connected to the lead 25 though the metallic wire 105. The semiconductor chip 103 having the above structure is bonded onto the Ag-plated film 22 formed on the chip bonding surface 24A by the adhesive 16.

In accordance with the lead frame according to this embodiment, by employing the Ag-plated film 22 with the carbon grains 34 arranged in the gaps 33 among the Ag crystal grains 31 as the metallic film to be connected to the metallic wire 15, 105 (e.g. Au wire) connected to the electrode pad 36 of the semiconductor chip 103, 107 of the semiconductor chip 12, the carbon grains 34 block the diffusion paths (gaps 33 among the Ag crystal grains 31) of Cu (Cu contained in the lead frame body 21). Thus, in heating the lead frame body 21 while the semiconductor device 100 is manufactured, it is possible to prevent Cu contained in the lead frame body 21 from being deposited onto the upper surface 22A of the Ag-plated film 22. Accordingly, the thickness A of the Ag-plated film 22 can be decreased (e.g. 0.3 μm to 3 μm) so that the lead frame 101 can be reduced in cost and the metallic wire 15, 105 can be surely connected to the upper surface 22A of the Ag-plated film 22.

Further, in accordance with the semiconductor device according to this embodiment, by providing the lead frame 101 reduced in cost and improved in productivity, the semiconductor device 100 can be reduced in cost and improved in productivity.

The Ag-plated film 22 formed in the semiconductor device 100 according to this embodiment can be formed by executing the same processing as the steps shown in FIGS. 7 to 9 using the plating device in which the second plating mask 54 is excluded from the configuration of the plating device 47 shown in FIG. 7 explained in the first embodiment.

In the semiconductor device 100 according to this embodiment, although the Ag-plated film 22 is also formed on the chip bonding surface 24A, the Ag-plated film 22 has only to be formed in the lead frame body 21 at the portion corresponding to the region of forming the metallic wire 15, 105 and the Ag-plated film 22 may not be formed on the chip bonding surface 24A.

Figure 19:
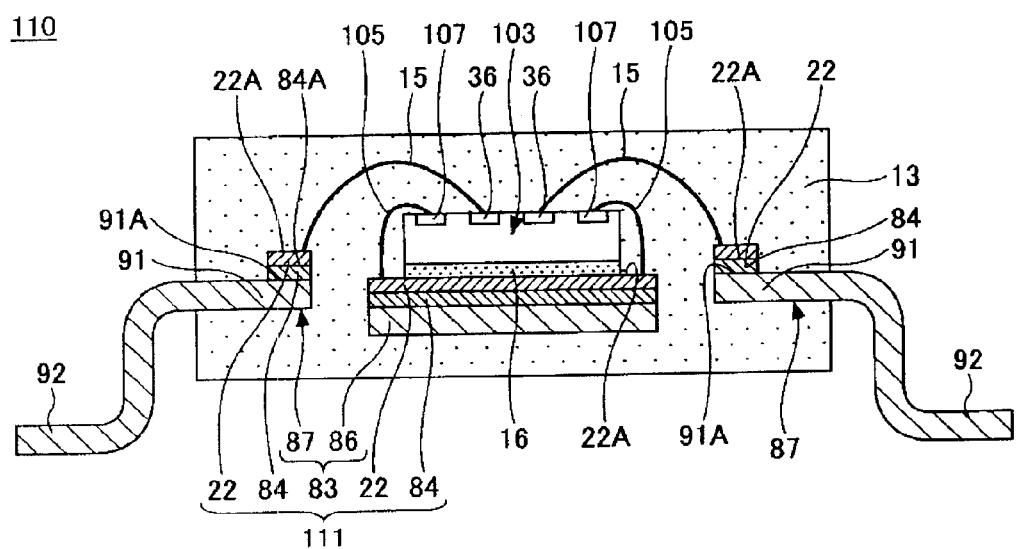
FIG. 19 is a sectional view of a semiconductor device according to a modification of the third embodiment of this invention.

FIG. 19 is a sectional view of a semiconductor device according to a modification of the third embodiment of this invention. In FIG. 19, like reference symbols refer to like parts in the semiconductor device 100 according to the third embodiment and the semiconductor device 80 according to the second embodiment.

Referring to FIG. 19, a semiconductor device 110 according to the modification of the third embodiment is structured in the same fashion as the semiconductor device 100 except that a lead frame 111 is provided in place of the lead frame 101 provided in the semiconductor device 100 according to the third embodiment.

The lead frame 111 is structured in the same fashion as the lead frame 101 except that the lead frame body 83 explained in the second embodiment (lead frame body made of the material containing very little Cu (e.g. 42 alloy)) is provided in place of the Lead frame body 21 (the lead frame body made of Cu or Cu alloy) provided in the lead frame 101, and the Cu plated film 84 explained in the second embodiment is formed between the Ag-plated film 22 and the lead frame body 83 so as to be in contact with the Ag-plated film 22 and lead frame body 83.

The lead frame 111 and semiconductor device 110 having the above structure can provide the same advantage as the lead frame 101 and semiconductor device 100 according to the third embodiment.

Besides, in the present invention, nanoparticles may be nanocarbon substances, carbon nanoparticles, carbon nanotube or almuna et al. in addition to carbon grains.

The detailed explanation has been hitherto made of the preferred embodiments of this invention. However, this invention should not be limited to these specific embodiments but may be modified or changed in various manners within the scope of this invention described in claims.

This invention can be applied to the lead frame provided in a lead frame body and having an Ag film (including the Ag-plated film) connected to the metallic wire connected to the electrode pad of the semiconductor chip, a method for manufacturing the same and the semiconductor device having the same.

What is claimed is:

1. A lead frame comprising:
a lead frame body made of Cu or an alloy containing Cu, the lead frame body having a die pad to which a semiconductor chip is bonded and a plurality of leads arranged around the die pad, and
a metallic film formed on the lead frame body, the metallic film to be connected to a metallic wire connected to an electrode pad of the semiconductor chip, wherein
the metallic film is an Ag-plated film containing carbon grain nanoparticles arranged in gaps among Ag crystal grains of the Ag-plated film.

2. A lead frame comprising:
a lead frame body having a die pad to which a semiconductor chip is bonded and a plurality of leads arranged around the die pad,
a Cu film formed on the lead frame body, and
a metallic film formed on the Cu film, the metallic film to be connected to a metallic wire connected to an electrode pad of the semiconductor chip, wherein
the metallic film is an Ag-plated film containing carbon grain nanoparticles arranged in gaps among Ag crystal grains of the Ag-plated film.

3. The lead frame according to claim 1, wherein the diameter of each of the nanoparticles is within a range from 0.01 μm to 0.5 μm.

4. A semiconductor device comprising:
the lead frame according to claim 1,
the semiconductor chip bonded to the die pad,
the metallic wire electrically connecting the metallic film and the electrode pad, and
a mold resin sealing a part of the leads, the semiconductor chip, the metallic wire and the Ag-plated film.

5. The lead frame according to claim 2, wherein the diameter of each of the nanoparticles is within a range from 0.01 μm to 0.5 μm.

6. A semiconductor device comprising:
the lead frame according to claim 2,
the semiconductor chip bonded to the die pad,
the metallic wire electrically connecting the metallic film and the electrode pad, and
a mold resin sealing a part of the leads, the semiconductor chip, the metallic wire and the Ag-plated film.

7. The lead frame according to claim 1, wherein the Ag-plated film is formed of the Ag crystal grains, the gaps among Ag crystal grains of the Ag-plated film define a path of diffusion through the Ag-plated film, and the carbon grain nanoparticles are provided in the gaps among the Ag crystal grains so as to block the path of diffusion through the Ag-plated film.

8. The lead frame according to claim 2, wherein the Ag-plated film is formed of the Ag crystal grains, the gaps among Ag crystal grains of the Ag-plated film define a path of diffusion through the Ag-plated film, and the carbon grain nanoparticles are provided in the gaps among the Ag crystal grains so as to block the path of diffusion through the Ag-plated film.

9. The lead frame according to claim 1, wherein the Ag-plated film is formed directly on the lead frame body.

10. The lead frame according to claim 2, wherein the Ag-plated film is formed directly on the Cu film.

11. The lead frame according to claim 1, wherein the Ag-plated film is formed of an Ag plating solution containing the carbon grain nanoparticles.

12. The lead frame according to claim 2, wherein the Ag-plated film is formed of an Ag plating solution containing the carbon grain nanoparticles.

13. The lead frame according to claim 1, wherein the Ag-plated film contains the carbon grain nanoparticles in a weight percentage in a range of 0.1 wt % to 20 wt %.

14. The lead frame according to claim 2, wherein the Ag-plated film contains the carbon grain nanoparticles in a weight percentage in a range of 0.1 wt % to 20 wt %.

* * * * *